(12) United States Patent
Yavid

(10) Patent No.: US 10,355,623 B1
(45) Date of Patent: Jul. 16, 2019

(54) GENERATOR EMPLOYING PIEZOELECTRIC AND RESONATING ELEMENTS WITH SYNCHRONIZED HEAT DELIVERY

(71) Applicant: Dmitriy Yavid, Stony Book, NY (US)

(72) Inventor: Dmitriy Yavid, Stony Book, NY (US)

( * ) Notice: Subject to any disclaimer, the term of this patent is extended or adjusted under 35 U.S.C. 154(b) by 356 days.

(21) Appl. No.: 15/412,680

(22) Filed: Jan. 23, 2017

Related U.S. Application Data

(60) Continuation-in-part of application No. 14/872,331, filed on Oct. 1, 2015, now Pat. No. 9,590,534, which is a continuation of application No. 14/060,121, filed on Oct. 22, 2013, now abandoned, which is a division of application No. 11/635,775, filed on Dec. 7, 2006, now abandoned.

(51) Int. Cl.
| | | |
|---|---|---|
| *H02N 2/18* | (2006.01) | |
| *H01L 41/113* | (2006.01) | |
| *H03H 9/17* | (2006.01) | |
| *H03H 9/125* | (2006.01) | |

(52) U.S. Cl.
CPC ........... *H02N 2/181* (2013.01); *H01L 41/113* (2013.01); *H02N 2/185* (2013.01); *H03H 9/125* (2013.01); *H03H 9/17* (2013.01)

(58) Field of Classification Search
CPC ..... H02N 2/18; H01L 41/113; H01L 41/1134; H01L 41/1136; H01L 41/1138
USPC ......................................................... 310/339
See application file for complete search history.

(56) References Cited

U.S. PATENT DOCUMENTS

| | | |
|---|---|---|
| 3,211,931 A | 10/1965 | Tehon |
| 3,991,606 A | 11/1976 | Dreyer |
| 4,019,073 A | 4/1977 | Vishnevsky et al. |
| 4,129,850 A | 12/1978 | Mumper |
| 4,316,413 A | 2/1982 | Wedner et al. |
| 4,339,682 A | 7/1982 | Toda et al. |
| 4,392,074 A | 7/1983 | Kleinschmidt et al. |
| 4,434,717 A | 3/1984 | Erickson |
| 4,453,103 A | 6/1984 | Vishnevsky et al. |
| 4,562,374 A | 12/1985 | Sashida |
| 4,752,711 A | 6/1988 | Tsukimoto et al. |
| 4,798,990 A | 1/1989 | Henoch |

(Continued)

FOREIGN PATENT DOCUMENTS

EP 1 589 643 2/2005

*Primary Examiner* — Derek J Rosenau

(74) *Attorney, Agent, or Firm* — Donald J. Ersler

(57) ABSTRACT

Disclosed are various embodiments of systems, devices and methods for generating electricity, transforming voltages and generating motion using one or more piezoelectric elements operably coupled to one or more non-piezoelectric resonating elements. In one embodiment, a non-piezoelectric resonating element is configured to oscillate and dissipate mechanical energy into a piezoelectric element, which converts a portion of such mechanical energy into electricity and therefore acts as a generator. In another embodiment, a piezoelectric element is configured to drive one or more mechanical elements operably coupled to the one or more non-piezoelectric resonating elements, and therefore acts as a motor. In still another embodiment, a piezoelectric element is operably coupled to a non-piezoelectric resonating element to form an electrical transformer. The mechanical properties of the non-piezoelectric resonating elements are typically selected to permit relatively high permissible stress and strain in comparison to the corresponding piezoelectric elements to which coupled or attached.

11 Claims, 17 Drawing Sheets

(56) References Cited

U.S. PATENT DOCUMENTS

| | | |
|---|---|---|
| 4,884,002 A | 11/1989 | Eusemann et al. |
| 4,959,580 A | 9/1990 | Vishnevsky et al. |
| 5,020,370 A | 6/1991 | Deval et al. |
| 5,023,504 A | 6/1991 | Mooney et al. |
| 5,123,285 A | 6/1992 | Lew |
| 5,191,688 A | 3/1993 | Takizawa et al. |
| 5,296,776 A | 3/1994 | Wind et al. |
| 5,301,613 A | 4/1994 | Muirhead |
| 5,438,231 A | 8/1995 | Khoshnevisan et al. |
| 5,442,251 A | 8/1995 | Kaida et al. |
| 5,477,100 A | 12/1995 | Kataoka |
| 5,511,427 A | 4/1996 | Burns |
| 5,583,293 A | 12/1996 | Flogel |
| 5,596,241 A | 1/1997 | Seki et al. |
| 5,621,263 A | 4/1997 | Kaida |
| 5,644,184 A | 7/1997 | Kucherov et al. |
| 5,672,930 A | 9/1997 | Narisawa et al. |
| 5,691,752 A | 11/1997 | Moynihan et al. |
| 5,748,566 A | 5/1998 | Goodson |
| 5,801,475 A | 9/1998 | Kimura |
| 5,917,268 A | 6/1999 | Takagi |
| 5,936,328 A | 8/1999 | Takano et al. |
| 5,962,954 A | 10/1999 | Leers et al. |
| 5,998,908 A | 12/1999 | Goodson |
| 6,013,970 A | 6/2000 | Nishiwaki et al. |
| 6,138,562 A | 10/2000 | Hertz et al. |
| 6,347,862 B1 | 2/2002 | Kanno et al. |
| 6,392,332 B1 | 5/2002 | Sung |
| 6,707,232 B2 | 3/2004 | Lino et al. |
| 6,830,944 B1 | 12/2004 | Smits |
| 6,911,107 B2 | 6/2005 | Kagawa et al. |
| 6,952,071 B2 | 10/2005 | Bax |
| 6,979,935 B2 | 12/2005 | Lino et al. |
| 6,989,624 B2 | 1/2006 | Tsukimoto et al. |
| 7,002,284 B2 | 2/2006 | Ouchi et al. |
| 7,081,693 B2 | 7/2006 | Hamel et al. |
| 7,089,638 B2 | 8/2006 | Yi et al. |

GENERATOR EMPLOYING PIEZOLECTRIC AND RESONATING ELEMENTS WITH SYNCHRONIZED HEAT DELIVERY

CROSS-REFERENCES TO RELATED APPLICATIONS

This is a continuation-in-part application, which takes priority from continuation-in-part application Ser. No. 14/872,331, filed on Oct. 1, 2015, which takes priority from divisional application Ser. No. 14/060,121, filed on Oct. 22, 2013, which takes priority from non-provisional application Ser. No. 11/635,775, filed on Dec. 7, 2006.

FIELD OF THE INVENTION

The present invention relates to the field of generators, motors and transformers employing piezoelectric elements.

BACKGROUND

Different forms of rotating generators and motors are known. Typical rotating motors and generators employ electromagnetic methods to convert electrical energy to mechanical energy, or vice-versa. The construction of an electromagnetic motor or generator is generally complicated. Materials such as copper or iron are often employed in their construction, rendering such rotating motors and generators difficult to use in application requiring small size owing to their weight and bulk. The susceptibility of electromagnetic motors and generators to the influence of magnetic fields also limits their use in many applications.

A particular problem occurs when efforts are made to miniaturize electromagnetic motors and generators. While it is possible to scale down the size of the motors and generators to produce low-power units, electrical conversion efficiency is appreciably reduced and furthermore the fabrication of miniaturized units may be extremely complex. Many presently available commercial electrical motors and generators are not suitable for use in low power applications.

Although piezoelectric generators and motors of small size are known, many such devices suffer from limitations inherent in the various materials employed to form the piezoelectric elements thereof. For example, many piezoelectric materials have permissible strains less than 0.1%, which rather severely limits the amount of mechanical motion or electrical current that can be generated using piezoelectric elements.

What is needed is a piezoelectric motor, generator or transformer having a simple structure, that is light-weight, has low power consumption, permits easy control of speed and direction, produces no or low magnetic field interference with other devices and systems, and that is capable of generating higher levels of electrical current or power, or of increased mechanical output.

Various patents containing subject matter relating directly or indirectly to the field of the present invention include, but are not limited to, the following:

U.S. Pat. No. 3,211,931 to Tehon for "Electromechanical Transducer Motors," Oct. 12, 1965.

U.S. Pat. No. 3,991,606 to Dreyer for "Apparatus and Method for Converting Mechanical Wave Energy to Optical Energy," Nov. 16, 1976.

U.S. Pat. No. 4,019,073 to Vishnevsky et al. for "Piezoelectric Motor Structures," Apr. 19, 1977.

U.S. Pat. No. 4,129,850 to Mumper for "Balanced Transducer," Dec. 12, 1978.

U.S. Pat. No. 4,316,413 to Wedner et al. for "Generator for a spin-projectile," Feb. 23, 1982.

U.S. Pat. No. 4,339,682 to Toda et al. for "Rotative Motor Using a Piezoelectric Element," Jul. 13, 1982.

U.S. Pat. No. 4,392,074 to Kleinschmidt et al. for "Trigger Device and Piezo-Ignition Coupler With Galvanic Decoupling," Jul. 5, 1983.

U.S. Pat. No. 4,434,717 to Erickson for "Hybrid fuse triggering device," Mar. 6, 1984.

U.S. Pat. No. 4,453,103 to Vishnevsky at al., for "Piezoelectric Motor," Jun. 5, 1984.

U.S. Pat. No. 4,562,374 to Sashida for "Motor Device Utilizing Ultrasonic Oscillation," Dec. 31, 1985.

U.S. Pat. No. 4,752,711 to Tsukimoto et al. for "Vibration Wave Motor," Jun. 21, 1988.

U.S. Pat. No. 4,798,990 to Henoch for "Device for Transmitting Electric Energy to Computers and Data Nets," Jan. 17, 1989.

U.S. Pat. No. 4,884,002 to Eusemann et al. for "Rotary or Linear Electric Motor Whose Armature is Driven by Means of Ultrasonic Vibrations," Nov. 28, 1989.

U.S. Pat. No. 4,959,580 to Vishnevsky et al. for "Piezoelectric Motor," Sep. 25, 1990.

U.S. Pat. No. 5,020,370 to Deval et al. for "Vibrating Beam Force-Frequency Transducer and Pendulous Accelerator Comprising Application Thereof," Jun. 4, 1991.

U.S. Pat. No. 5,023,504 to Mooney et al. for "Piezo-Electric Resonating Vibrator for Selective Call Receiver," Jun. 11, 1991.

U.S. Pat. No. 5,123,285 to Lew for "Piezo Electric Impulse Sensor," Jun. 23, 1992

U.S. Pat. No. 5,191,688 to Takizawa et al. for "Method for Producing a Superior Longitudinal Vibrator," Mar. 9, 1993.

U.S. Pat. No. 5,296,776 to Wind et al. for "Piezo-Electric Motor Intended for a Timepiece," Mar. 22, 1994.

U.S. Pat. No. 5,301,613 to Muirhead for "Power supply for an electrical circuit mounted on a projectile," Apr. 12, 1994.

U.S. Pat. No. 5,438,231 to Khoshnevisan et al. for "Thin Film Micromechanical Resonator Gyro," Aug. 1, 1995.

U.S. Pat. No. 5,442,251 to Kaida et al. for "Vibrating Unit," Aug. 15, 1995.

U.S. Pat. No. 5,477,100 to Kataoka for "Vibration Type Motor System," Dec. 19, 1995.

U.S. Pat. No. 5,511,427 to Burns for "Cantilevered Microbeam Temperature Sensor," Apr. 30, 1996.

U.S. Pat. No. 5,583,293 to Flogel for "Sonic or Ultrasonic Transducer," Dec. 10, 1996.

U.S. Pat. No. 5,596,241 to Seki et al. for "Vibration Wave Driven Linear-Motor or Printer," Jan. 21, 1997.

U.S. Pat. No. 5,621,263 to Kaida for "Piezoelectric Resonance Component," Apr. 15, 1997.

U.S. Pat. No. 5,644,184 to Kucherov et al. for "Piezo-Pyroelectric Energy Converter and Method," Jul. 1, 1997.

U.S. Pat. No. 5,672,930 to Narisawa et al. for "Vibration Motor," Sep. 30, 1997.

U.S. Pat. No. 5,691,752 to Moynihan et al. for "Perovskite thin-film ink jet transducer," Nov. 25, 1997.

U.S. Pat. No. 5,748,566 to Goodson for "Ultrasonic Transducer," May 5, 1998.

U.S. Pat. No. 5,801,475 to Kimura for "Piezo-Electricity Generation Device," Sep. 1, 1998.

U.S. Pat. No. 5,917,268 to Takagi for "Vibration Driven Motor," Jun. 29, 1999. U.S. Pat. No. 5,936,328 to Takano et al. for "Linear Vibration Actuator Utilizing Combined Bending and Longitudinal Vibration Modes," Aug. 10, 1999.

U.S. Pat. No. 5,962,954 to Leers et al. for "Piezo-Electric Transformer," Oct. 5, 1999.

U.S. Pat. No. 5,998,908 to Goodson for "Transducer Assembly Having Ceramic Structure," Dec. 7, 1999.

U.S. Pat. No. 6,013,970 to

U.S. Pat. No. 6,138,562 to Hertz et al. for "Vibrational Energy Waves for Assist in the Print Release Process for Screen Printing," Oct. 31, 2000.

U.S. Pat. No. 6,347,862 to Kanno et al. for "Ink jet head," Feb. 19, 2002.

U.S. Pat. No. 6,392,332 to Sung for "Laminated Piezo Ceramic Transformer Device," May 21, 2002.

U.S. Pat. No. 6,707,232 B2 to lino et al. for "Piezoelectric Driving Body, Ultrasonic Motor and Electronic Apparatus Having an Ultrasonic Motor," Mar. 16, 2004.

U.S. Pat. No. 6,830,944 to Smits for "Piezoelectric Bimorphs as Microelectromechanical Building Blocks and Constructions Made Using Same," Dec. 14, 2004.

U.S. Pat. No. 6,911,107 to Kagawa et al. for "Piezoelectric film type actuator, liquid discharge head, and method of manufacturing the same," Jun. 28, 2005.

U.S. Pat. No. 6,952,071 B2 to Bax for "Piezo-Electric Device," Oct. 4, 2005.

U.S. Pat. No. 6,979,935 to lino et al. for "Piezoelectric motor and electronic equipment with piezoelectric motor," Dec. 27, 2005.

U.S. Pat. No. 6,989,624 B2 to Tsukimoto et al. for "Vibration Element and Vibration Wave Driving Apparatus," Jan. 24, 2006.

U.S. Pat. No. 7,002,284 B2 to Ouchi et al. for "Thin-Film Micromechanical Resonator, Thin-Film Micromechanical Resonator Gyro, and Navigation System and Automobile Using the Resonator Gyro," Feb. 21, 2006.

U.S. Pat. No. 7,081,693 to Hamel et al. for "Energy harvesting for wireless sensor operation and data transmission," Jul. 25, 2006.

U.S. Pat. No. 7,089,638 to Yi et al. for "Method for fabricating a micromachined piezoelectric microspeaker," Aug. 15, 2006.

European Patent Application No. EP 1 589 643 A2 to Spooner for "Magnetic Force Transmission," Feb. 25, 2005.

The dates of the foregoing publications may correspond to any one of priority dates, filing dates, publication dates and issue dates. Listing of the above patents and patent applications in this background section is not, and shall not be construed as, an admission by the applicants or their counsel that one or more publications from the above list constitutes prior art in respect of the applicant's various inventions. All printed publications and patents referenced herein are hereby incorporated by referenced herein, each in its respective entirety.

Upon having read and understood the Summary, Detailed Descriptions and Claims set forth below, those skilled in the art will appreciate that at least some of the systems, devices, components and methods disclosed in the printed publications listed herein may be modified advantageously in accordance with the teachings of the various embodiments of the present invention.

SUMMARY OF THE INVENTION

Disclosed herein are various embodiments of systems, devices, components and methods for piezoelectric generators, motors and transformers having one or moreresonating elements forming operational portions thereof.

In one embodiment of the present invention, there is provided a piezoelectric generator comprising a piezoelectric element capable of generating electrical current in response to at least one of movement, deflection and stress being applied thereto by an external force, a non-piezoelectric resonating element operatively coupled to the piezoelectric element and configured to provide the external force thereto, and a moving element configured to cause at least one of mechanical movement and mechanical resonance in the resonating element, wherein the moving element causes at least one of mechanical movement and mechanical resonance in the resonating element when the moving element moves under a prescribed range of operating conditions, and electrical current is generated by the piezoelectric element when the resonating element applies external force thereto.

In another embodiment of the present invention, there is provided a piezoelectric motor comprising a piezoelectric element capable of deflecting or moving in response to an electrical current being applied thereto, a non-piezoelectric resonating element operatively coupled to the piezoelectric element and configured to resonate mechanically in response to the piezoelectric element deflecting or moving, and a moving element configured to move in response to the resonating element resonating under a prescribed range of operating conditions, wherein the moving element moves when electrical current is provided to the piezoelectric element and the resonating element resonates in response thereto under the prescribed range of operating conditions.

In still another embodiment of the present invention, there is provided a method of generating electricity, comprising operably coupling a piezoelectric element to a non-piezoelectric resonating element, using a moving element to deflect the resonating element to a first position a, releasing the resonating element from the first position a and permitting the resonating element to deflect to a second position b, permitting the resonating element to oscillate between the first and second positions a and b, transferring mechanical energy generated by the oscillating resonating element to the piezoelectric element, and generating electricity in the piezoelectric element in response to the mechanical energy being provided thereto.

In yet another embodiment of the present invention, there is provided a method of generating electricity comprising providing a piezoelectric element capable of generating electrical current in response to at least one of movement, deflection and stress being applied to the piezoelectric element by an external force, providing a non-piezoelectric resonating element operatively coupled to the piezoelectric element and configured to provide the external force thereto, providing a moving element configured to cause at least one of mechanical movement and mechanical resonance in the resonating element, wherein the moving element causes at least one of mechanical movement and mechanical resonance in the resonating element when the moving element moves under a prescribed range of operating conditions, and generating electrical current in the piezoelectric element when the resonating element applies external force thereto.

In yet a further embodiment of the present invention, there is provided a method of generating motion in a moving element comprising providing a piezoelectric element capable of deflecting or moving in response to electrical current being provided thereto by an external source of electricity, providing a non-piezoelectric resonating element operatively coupled to the piezoelectric element and having a portion thereof configured to deflect mechanically in response to piezoelectric element deflecting or moving, providing a moving element configured to move in response to the resonating element deflecting, and generating motion in the moving element when the piezoelectric element has electrical current provided thereto.

In addition to the foregoing embodiments of the present invention, review of the detailed description and accompanying drawings will show that there are still other embodiments of the present invention. Accordingly, many combinations, permutations, variations and modifications of the foregoing embodiments of the present invention not set forth explicitly herein will nevertheless fall within the scope of the present invention.

BRIEF DESCRIPTION OF THE DRAWINGS

Different aspects of the various embodiments of the present invention will become apparent from the following specification, drawings and claims in which:

The drawings are not necessarily to scale. Like numbers refer to like parts or steps throughout the drawings.

DETAILED DESCRIPTION

Figure 1:
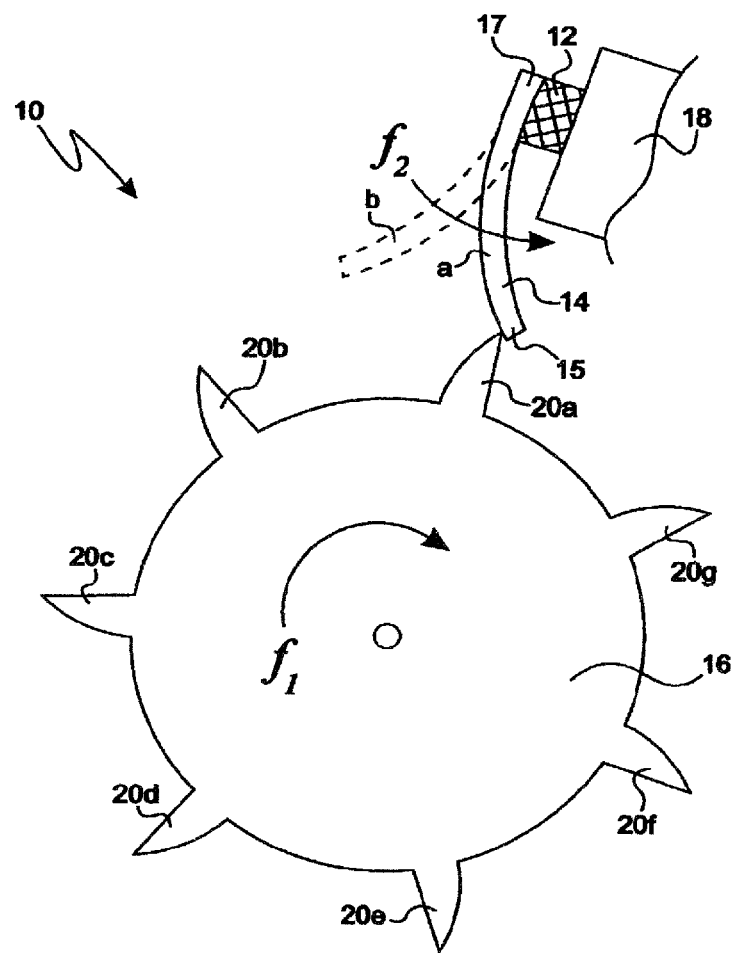
FIG. 1 shows one embodiment of piezoelectric generator 10 of the present comprising rotor or mechanically moving element 16 having teeth 20a-20g disposed along the outer periphery thereof.

Set forth below are detailed descriptions of some preferred embodiments of the systems, devices, components and methods of the present invention.

The amount of energy E a mechanical element can store that is formed of a given material is given by the equation:

$$E = Y \cdot \varepsilon^2 \cdot V \qquad (\text{eq. 1})$$

where:
Y is Young's modulus of a material;
ε is the strain the material undergoes in response to an external stress or force being applied thereto, and
V is the volume of the material subjected to the external force and under strain.

If the material subjected to stress is a piezoelectric material, energy may be converted from mechanical to electrical forms by the piezoelectric material (or vice-versa). The amount of power which can be converted continuously by a piezoelectric material is given by the equation:

$$P = f \cdot k \cdot E \qquad (\text{eq. 2})$$

where:
P is the amount of power converted by the piezoelectric material;
f is the frequency of the mechanical oscillations of the external force applied to the piezoelectric material, and
k is the energy conversion coefficient.

When mechanical resonance is induced in a piezoelectric element, the frequency at which the piezoelectric element resonates is limited by its longest dimension and other factors. Accordingly, a piezoelectric element having relatively large physical dimensions has limited ability to convert power owing to the low frequency at which it operates. Conversely, a piezoelectric element having small physical dimensions but high resonating frequency typically undergoes very small displacements, which are difficult to couple effectively to other elements of a generator, motor or transformer.

Permissible strain in a piezoelectric element is given by the equation:

$$\varepsilon = \frac{h\delta}{l^2} \qquad (\text{eq. 3})$$

where:
ε is the permissible strain of a material (usually less than 1%);
δ is the displacement of the distal end 15 of resonating element 14;
h is the thickness of resonating element 14, and
l is the length of resonating element 14.

In accordance with various embodiments of the present invention, therefore, piezoelectric machines such as generators, motors and transformers are made smaller and rendered more efficient by coupling a non-piezoelectric resonating element to a piezoelectric transducer. The non-piezoelectric resonating element provides a mechanical force or load to the piezoelectric transducer. In a preferred embodiment of the present invention, the non-piezoelectric resonating element is formed of a material such as steel, bronze, metal, a metal alloy, a combination of metals, plastic, polymer, carbon fiber, KEVLAR™, or silicon, or combinations, laminations or composites of the foregoing, where the non-piezoelectric resonating element most preferably, although not necessarily, has a relatively high Young's Modulus, and therefore has high permissible strain and a high Q-factor exceeding those of a conventional piezoelectric material. The non-piezoelectric resonating element of the present invention permits relatively large displacements of conventional mechanical elements to be coupled effectively and efficiently to conventional piezoelectric elements characterized by relatively small displacements. The foregoing principles are illustrated by referring to the Figures and the accompanying text set forth below.

FIG. 1 shows piezoelectric generator 10 comprising piezoelectric element 12 attached to base 18 and proximal end 17 of non-piezoelectric resonating element 14. An externally-provided force $f_1$ turns rotor or mechanically moving element 16 having teeth 20a, 20b, 20c, 20d, 20e, 20f and 20g disposed along the outer periphery thereof. As moving element 16 rotates, tooth 20a deflects distal end 15 of resonating element 14 into first position a. As moving element 16 continues to rotate, distal end 15 of resonating element 14 releases from tooth 20a, and under the action of force $f_2$ imparted by element 14 deflects into second position b, and then oscillates while tooth 20b advances in the direction of resonating element 14. Meanwhile, distal end 15 oscillates and dissipates mechanical energy generated by such oscillation through proximal end 17 into piezoelectric element 12. A portion of the mechanical energy transferred into piezoelectric element 12 from resonating element 14 is converted into electrical energy by piezoelectric element 12. Once tooth 20b engages resonating element 14 and deflects element 14 into first position a, the process repeats. Note that more than one resonating element 14 may be disposed along the periphery of moving element 16. Note further that an electrical circuit for storing and/or transferring electrical energy output by piezoelectric element 12 in response to stress introduced therein by resonating element 14 is not shown in FIG. 1, such circuits being well known to those skilled in the art.

The characteristics, materials and dimensions of non-piezoelectric resonating element 14 are most preferably selected to maximize the efficiency with which resonating element 14 transfers energy from moving element 16 to piezoelectric element 12. For example, during those periods of time when distal end 15 of resonating element 14 is freely oscillating between adjacent teeth, the resonating frequency, length and width of resonating element 14, and the material(s) from which resonating element 14 are formed, are most preferably selected so that continued mechanical oscillation of resonating element 14 has substantially subsided or abated by the time the next tooth engages and deflects distal end 15 of resonating element 14.

The principal resonant frequency and the stiffness of resonating element 14 should be selected to permit the piezoelectric element to constitute the main source of loss in the mechanical resonance of the system. The number of resonating elements 14 may be greater than one and may be higher, lower, or equal to the number of teeth or deflecting elements 17 in rotor or moving element 16. If multiple resonating elements 14 are employed, such elements 14 need not have the same or equal resonant frequencies. Indeed, certain advantages may obtain from having a plurality of resonating members having different resonant frequencies, depending on the particular application at hand.

Continuing to refer to FIG. 1, the displacement of the free or distal end 15 of resonating element 14 is proportional to the square of the length of element 14 between its distal and proximal ends 15 and 17. Because resonating element 14 of the present invention is formed from a non-piezoelectric material, its length can be much shorter than that of an otherwise similar resonating element formed from a piezoelectric material. This shorter length translates into a higher resonating frequency for resonating element 14 than a piezoelectric material would be capable of providing.

In addition to being able to operate at higher frequencies, the materials from which resonating element 14 are most preferably formed have relatively high Young's Modula, and therefore are capable of being deformed to a much greater extent than piezoelectric materials. For example, most piezoelectric materials have permissible strains that permit deformations on the order of 0.1%. Contrariwise, materials such as steel, metal, metal alloys, metal combinations, brass, silicon, some micro-machined micro-electrical mechanical systems (MEMS) semiconductor materials, and the like have permissible strains permitting deformations on the order of 0.5% to 1%, which are nearly an order of magnitude greater than those permitted by conventional piezoelectric materials.

One example of a preferred material from which to form resonating element 14 configured for use in a very small machine is silicon or a similar material such as a material suitable for use in fabricating MEMS semiconductor substrates, more about which I say below. Silicon has a higher permissible stain than steel and is also nearly lossless mechanically, unlike steel, which converts relatively large amounts of energy into heat during oscillation. The use of silicon to form resonating element 14 permits the construction of very small but highly efficient piezoelectric generators, motors and transformers, more about which I say below. MEMS batch fabrication techniques well known to those skilled in the art such as batch microfabrication processes, photolithography, wet and dry etching, oxidation, diffusion, low-pressure chemical vapor deposition (LPCVD), sputter deposition, plating, molding, substrate bonding, bulk silicon micromachining, and polysilicon surface micromachining may be employed to form resonating element 14, as well as to form moving element 16, piezoelectric element 12 and base 18 of the present invention. For example, very small beams or springs may be attached to, fabricated on or in a silicon substrate to form resonating element 14, which is then operatively coupled to piezoelectric element 12 disposed thereon. In one MEMS embodiment of the present invention, one or more magnets, magnetized materials or magnetic laminates are mounted on, in or to distal end 17 of resonating element 14 so as to cause resonating element 14 to move in the presence of a magnetic field.

Continuing to refer to FIG. 1, the frequency at which resonating element 14 vibrates in response to being deflected and released by teeth 20 is given by the equation:

$$f_p >> Qf_t \qquad \text{(eq. 4)}$$

where:
$f_p$ is the resonant frequency of resonating element 14;
$f_t$ is the frequency at teeth 20 hit the resonating 14, and
Q is the mechanical quality factor of resonating element 14.

Here, the "much greater" sign in equation 4 typically translates into frequency $f_p$ being 5 to 10 times greater than $f_t$.

Figure 2:
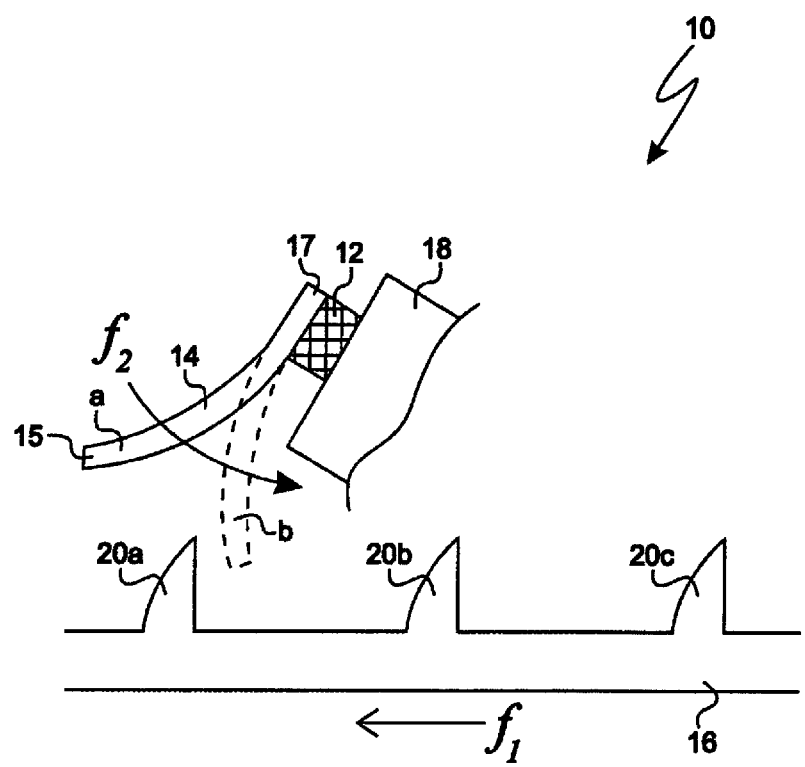
FIG. 2 shows another embodiment of piezoelectric generator 10 of the present invention comprising teeth 20a through 20c disposed on moving element or rod 16.

FIG. 2 shows another embodiment of piezoelectric generator 10 of the present invention, comprising piezoelectric element 12 attached to base 18 and proximal end 17 of non-piezoelectric resonating element 14. An externally-provided force $f_1$ pushes teeth 20a through 20c of moving element or rod 16 towards distal end 15 of non-piezoelectric resonating element 14. As shown in FIG. 2, resonating element 14 deflects into first position a under the action of force $f_1$. When tooth 20a advances past distal end 15 of resonating element 14, resonating element 14 deflects into second position b under the action of force $f_2$. While tooth 20b advances in the direction of resonating element 14, distal end 15 oscillates and dissipates mechanical energy generated by such oscillation through proximal end 17 into piezoelectric element 12. A portion of the mechanical energy transferred into piezoelectric element 12 from resonating element 14 is converted into electrical energy by piezoelectric element 12. Once tooth 20b engages resonating element 14 and deflects element 14 into first position a, the process repeats. As in FIG. 1, note that an electrical circuit for storing and/or transferring electrical energy output by piezoelectric element 12 in response to stress introduced therein by resonating element 14 is not shown in FIG. 2, such circuits being well known to those skilled in the art.

Figure 3:
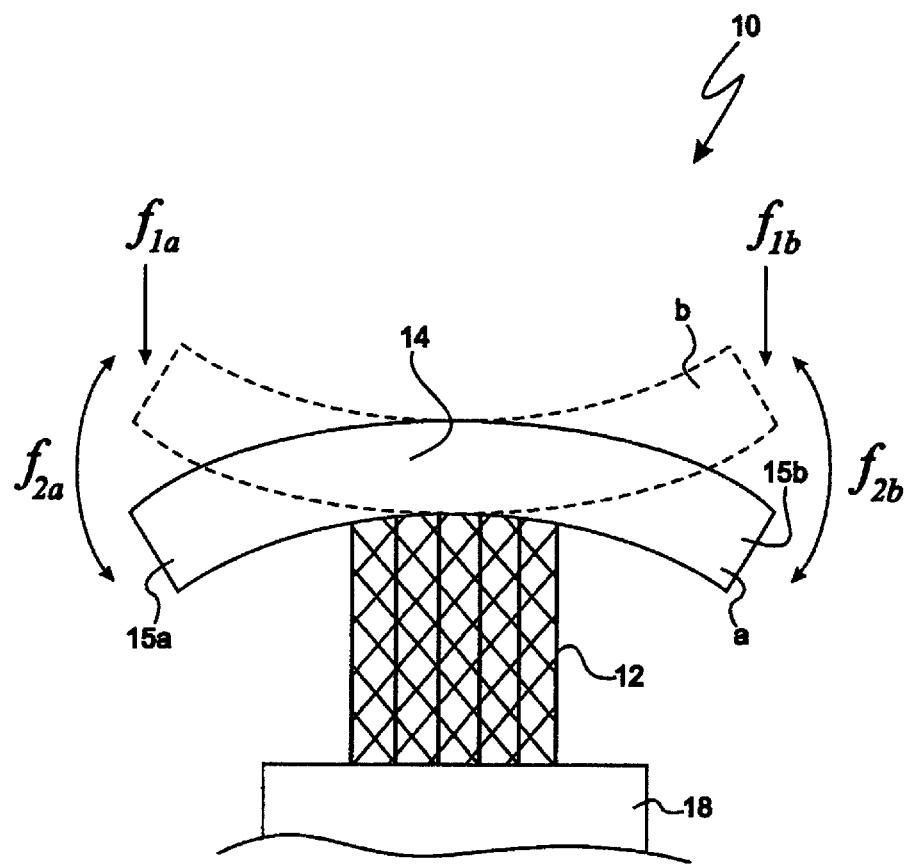
FIG. 3 shows yet another embodiment of piezoelectric generator 10 of the present invention comprising piezoelectric element 12 sandwiched between non-piezoelectric resonating element or spring bar 14 and base 18.

FIG. 3 shows yet another embodiment of piezoelectric generator 10 of the present invention, comprising piezoelectric element 12 sandwiched between non-piezoelectric resonating element or spring bar 14 and base 18. One or more external forces $f_{1a}$ and $f_{1b}$ deflect one or more of distal ends 15a and/or 15b of resonating element or spring bar 14. As shown in FIG. 3, resonating element 14 is deflected into first position a by external forces $f_{1a}$ and $f_{1b}$, forces $f_{1a}$ and $f_{1b}$ are released, resonating element 14 deflects into second position b under the action of forces $f_{2a}$ and $f_{2b}$ imparted by spring bar 14, and spring bar 14 oscillates and dissipates mechanical energy generated by the oscillation into piezoelectric element 12. A portion of the mechanical energy transferred into piezoelectric element 12 from spring bar 14 is converted into electrical energy by piezoelectric element 12. When external force f produced by acceleration of the projectile from the barrel is applied to one or more distal ends 15a and 15b, inertia provided by spring bar 14 causes deflection of bar 14 into first position a. Thereafter, distal ends 15a and 15b undergo further oscillation. The embodiment of the present invention illustrated in FIG. 3 may be adapted for use in armed projectiles, where generator 10 is a fuse that oscillates and generates electricity upon being ejected from the barrel of a gun, cannon, artillery piece, tank or other projectile-shooting device. Such an embodiment of the present invention eliminates the need for batteries in armed projectiles, which are known to have limited shelf life.

Figure 4:
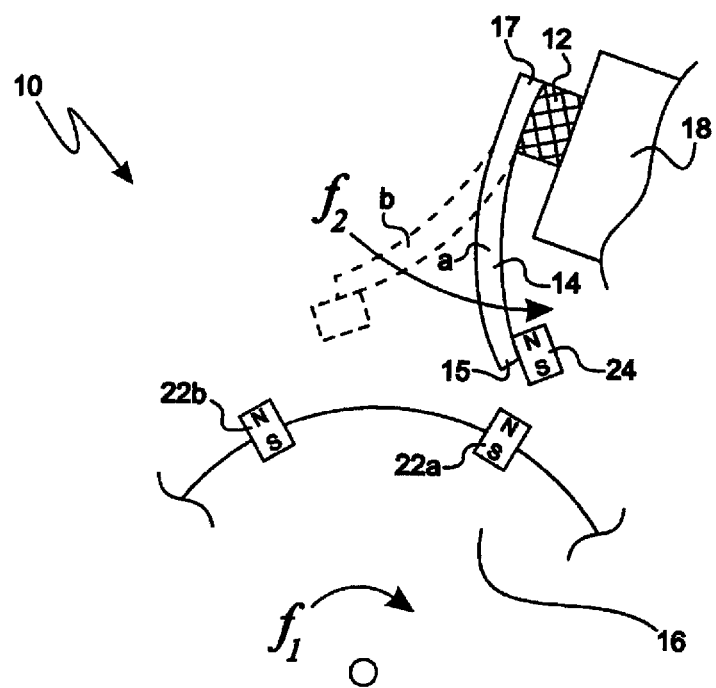
FIG. 4 shows still another embodiment of generator 10 of the present invention comprising magnets 22a and 22b mounted on the periphery of moving element or rotor 16.

FIG. 4 shows still another embodiment of generator 10 of the present invention, where magnets 22a and 22b mounted on the periphery of moving element or rotor 16 sweep past distal end 15 of resonating element 14 in response to an external force $f_1$ being provided to cause rotation of rotor 16. Resonating element 14 has mounted on distal end 15 thereof magnet 24. As magnet 22a sweeps past magnet 24, resonating element 14 deflects into first position a, and then deflects into second position b under the action of force $f_2$ imparted by element 14 after magnet 22a has moved past distal end 15. Resonating element 14 oscillates and dissipates mechanical energy generated by the oscillation into piezoelectric element 12. A portion of the mechanical energy transferred into piezoelectric element 12 from resonating beam or element 14 is converted into electrical energy by piezoelectric element 12. When magnet 22b moves into position beneath magnet 24, resonating element 14 deflects into first position a, and the process repeats.

Figure 5:
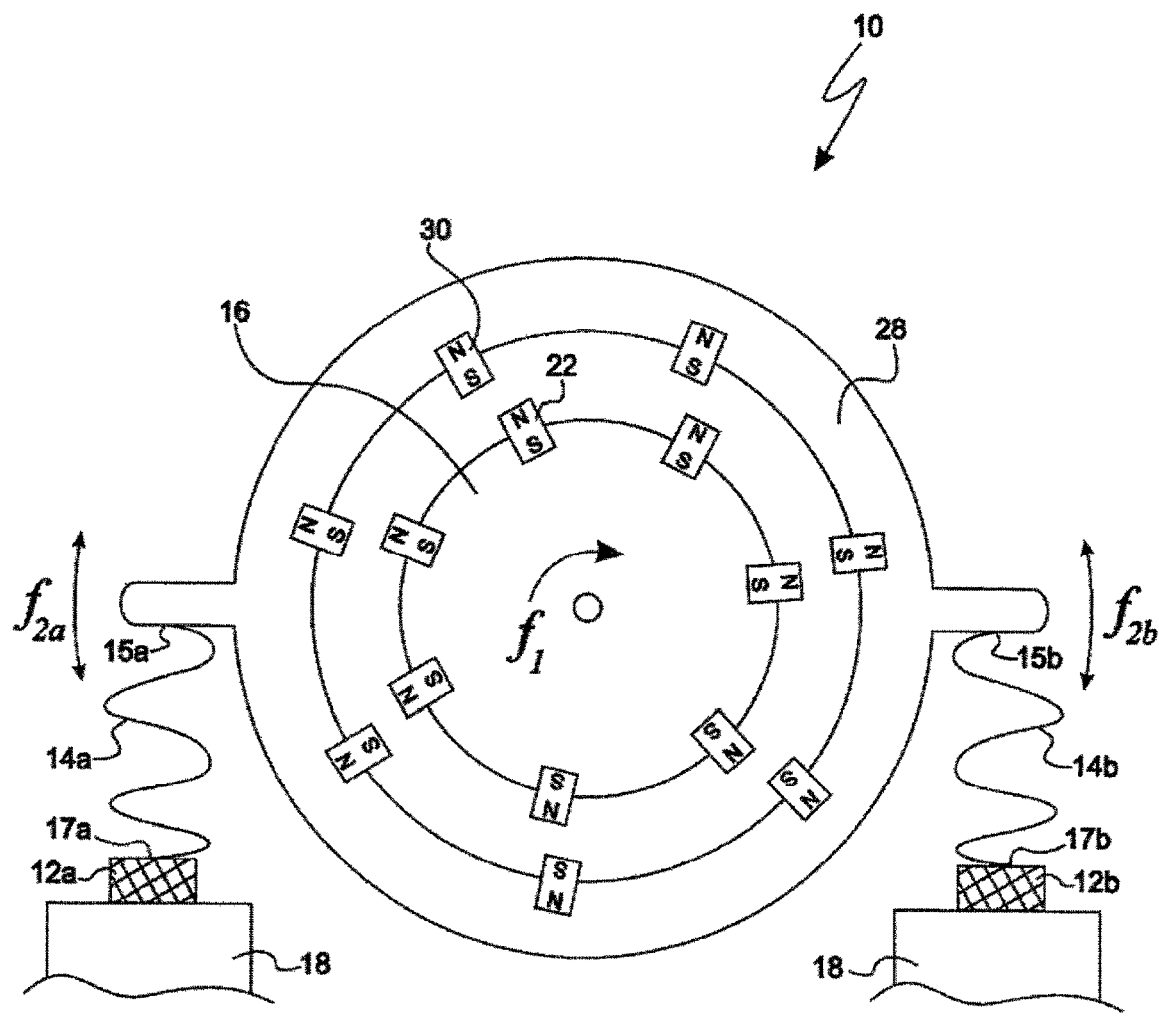
FIG. 5 shows yet another embodiment of generator 10 of the present invention comprising magnets 22 mounted on the outer periphery of moving element or rotor 16 that sweep past corresponding magnets 30 mounted on the inner periphery of stator 28.

FIG. 5 shows yet another embodiment of generator 10 of the present invention, where magnets 22 mounted on the outer periphery of moving element or rotor 16 sweep past corresponding magnets 30 mounted on the inner periphery of stator 28. External force $f_1$ causes rotation of rotor 16. The interaction of moving magnets 22 with substantially stationary magnets 30 causes stator 28 to oscillate in place between springs or resonating elements 14a and 14b, the proximal ends 17a and 17b of which are operably mounted on piezoelectric elements 12a and 12b, and the distal ends 15a and 15b of which are operably connected to stator 28. As magnets 22 sweep past magnets 24, resonating elements 14a and 14b deflect under the action of forces $f_{2a}$ and $f_{2b}$ provided by elements 14a and 14b after each magnet 22 causes a corresponding magnet 30 to move. Resonating elements 14a and 14b oscillate and dissipate mechanical energy generated by such oscillation into piezoelectric elements 12a and 12b. A portion of the mechanical energy transferred into piezoelectric elements 12a and 12b from resonating springs or elements 14a and 14b is converted into electrical energy by piezoelectric elements 12a and 12b. When magnets 22 move further along the insider periphery of stator 28 into position beneath magnets 24, resonating elements 14a and 14b deflects once again, and the process repeats.

Continuing to refer to FIG. 5, note that if the number of poles on rotor 16 equals the number of poles on stator 28, the number of principal sets of movement or oscillation of resonating elements 14a and 14b will equal the number of poles. If, however, the number of poles on rotor 16 does not equal the number of poles on stator 28, the number of principal sets of movement or oscillation of resonating elements 14a and 14b will be higher than either the number of rotor poles or stator poles. For example, where the numbers of poles on the rotor and stator are different by one, then the number of principal sets of movement of resonating elements 14a and 14b will equal the number of rotor poles times the number of stator poles. As a result, the individual principal oscillations induced in resonating elements 14a and 14b will be of smaller amplitude but greater frequency. This principle may be employed to increase the efficiency of various embodiments of piezoelectric generators, motors, and transformers of the present invention, and in particular in small such devices.

Figure 6A:
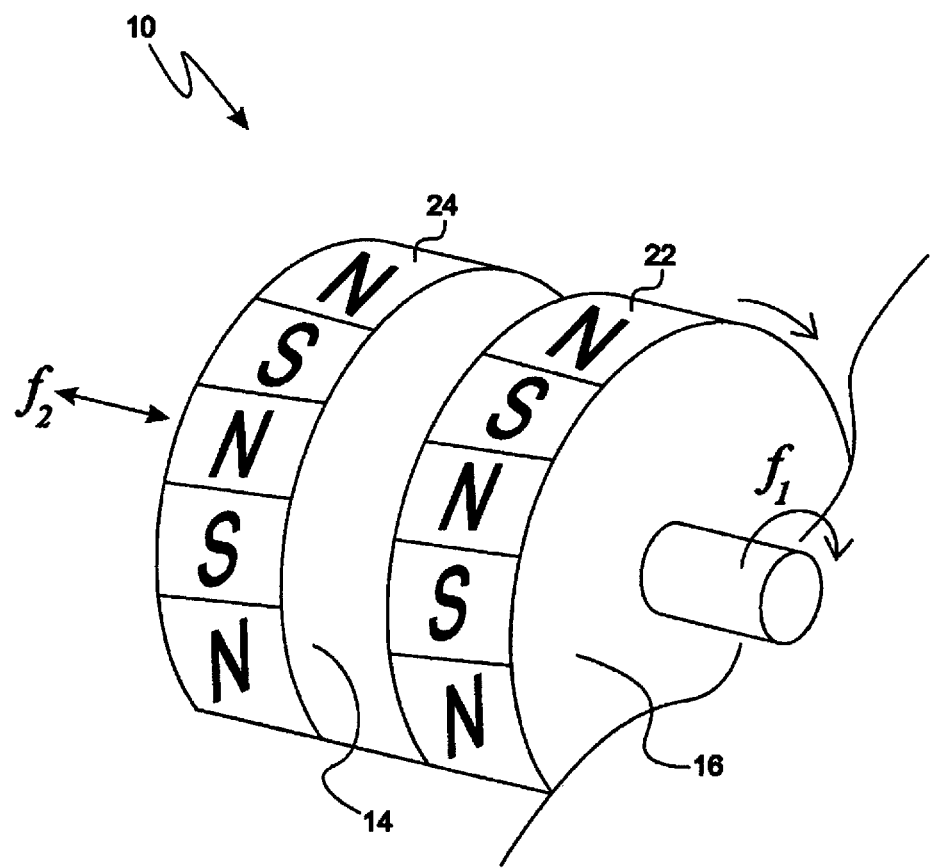
FIGS. 6a and 6b show another embodiment of generator 10 of the present invention, where magnets 22 mounted on the outer periphery of moving element or rotor 16 sweep past corresponding magnets 24 mounted on the outer periphery of resonating element or rotor 14.
Figure 6B:
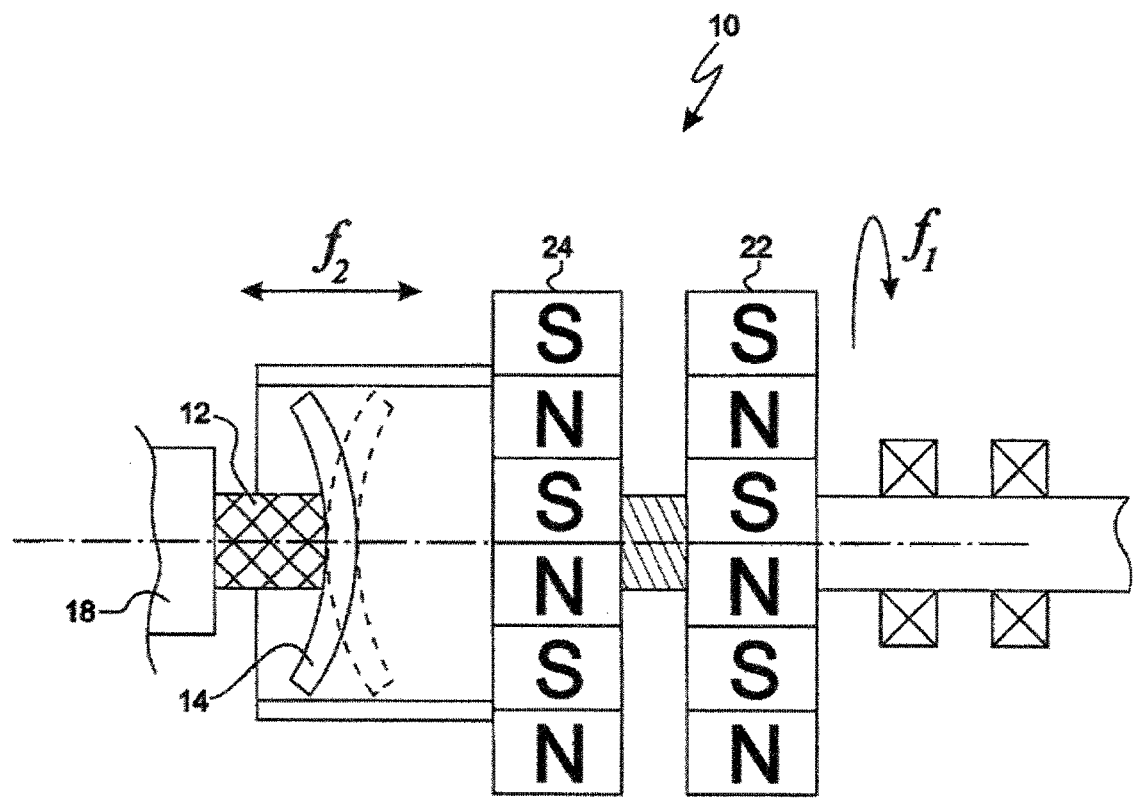

FIGS. 6a and 6b show another embodiment of generator 10 of the present invention, where magnets 22 mounted on the outer periphery of moving element or rotor 16 sweep past corresponding magnets 24 mounted on the outer periphery of resonating element or rotor 14. External force $f_1$ causes rotation of rotor 16. The interaction of moving magnets 22 with rotationally constrained magnets 24 causes resonating element or rotor 14 to oscillate under the action of force $f_2$ imparted by rotor 14 in a direction perpendicular to the direction of rotation of rotor 16. Not shown in FIG. 6a is a spring that biases rotor 14 against rotor 16, and that permits rotor 14 to oscillate back and forth along the axis of rotation of rotor 16. Also not shown in FIG. 6a is the operable coupling of such a spring to a piezoelectric element to permit mechanical energy generated by the oscillation of rotor 14 to be dissipated into piezoelectric element 12. FIG. 6b shows such operable coupling of elements 12, 14 and 16. A portion of the mechanical energy transferred into piezoelectric element 12 from resonating element 14 and its corresponding spring is converted into electrical energy by piezoelectric element 12. When magnets 22 move further along the periphery of rotor 14 into position adjacent magnets 24, resonating element 14 deflects once again, and the process repeats.

Figure 7:
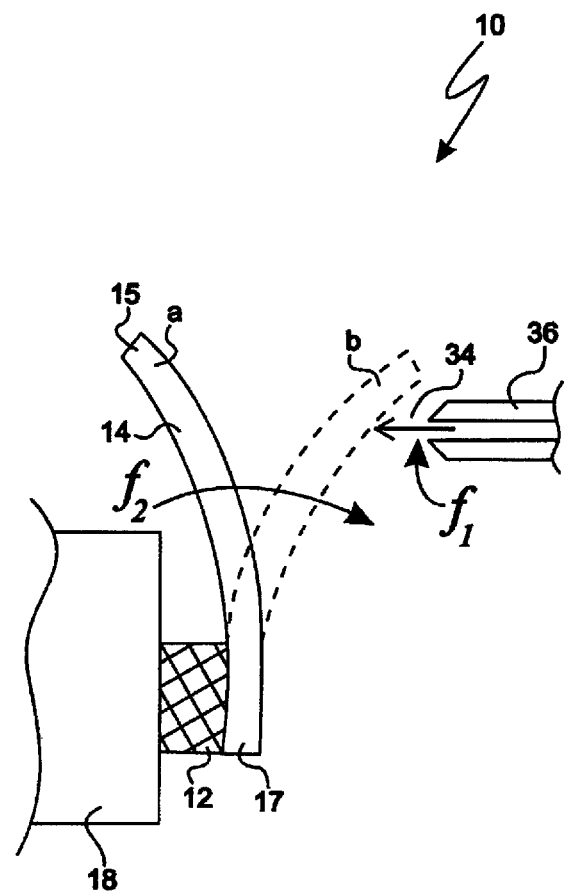
FIG. 7 shows yet another embodiment of piezoelectric generator 10 of the present invention comprising jet or orifice 36 configured to provide external force $f_1$ in the form of a jet or stream of liquid, gas or steam 34.

FIG. 7 shows yet another embodiment of piezoelectric generator 10 of the present invention, comprising piezoelectric element 12 attached to base 18 and proximal end 17 of non-piezoelectric resonating element 14, and jet or orifice 36 which provides external force $f_1$ in the form of a jet or stream of liquid, gas or steam 34. Note that as employed herein, the term "gas" includes within its scope air. Externally-provided jet or stream of gas, liquid or steam (providing force $f_1$) acts on distal end 15 of non-piezoelectric resonating element 14 through jet or orifice 36 for a first predetermined period of time and at a pressure sufficient, and at a distance sufficiently close, to cause the desired amount of deflection of distal end 15 of resonating element 14, after which first predetermined period of time the supply of gas, liquid or steam is terminated until the next cycle of providing force $f_1$ begins. As shown in FIG. 7, resonating element 14 deflects into first position a under the action of force $f_1$, force $f_1$ is released, resonating element 14 deflects into second position b under the action of force $f_2$, and then oscillates and provides mechanical energy to piezoelectric element 12 through proximal end 17. A portion of the mechanical energy transferred into piezoelectric element 12 from resonating element 14 is converted into electrical energy by piezoelectric element 12. After a second predetermined period of time has passed since the termination of providing external force $f_1$, force $f_1$ is provided again to deflect element 14 into first position a, and the process repeats.

Figure 8:
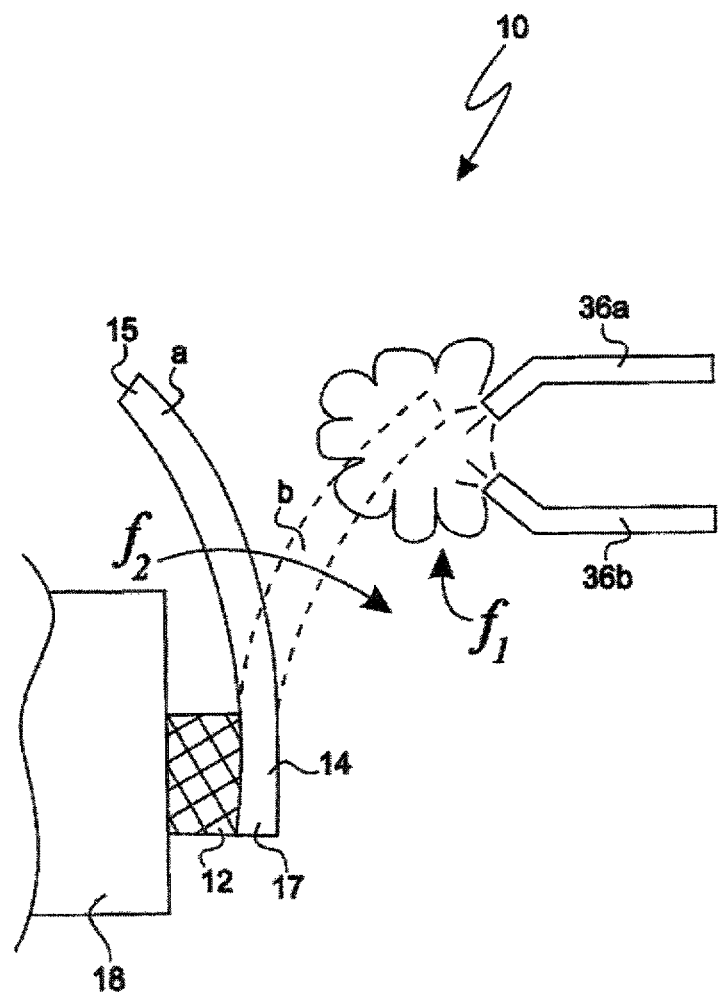
FIG. 8 shows still another embodiment of piezoelectric generator 10 of the present invention comprising jets or orifices 36a and 36b configured to provide external force $f_1$ in the form of a combustion product.

FIG. 8 shows still another embodiment of piezoelectric generator 10 of the present invention, comprising piezoelectric element 12 attached to base 18 and proximal end 17 of non-piezoelectric resonating element 14, and jets or orifices 36a and 36b configured to provide external force $f_1$ in the form of a combustion product (e.g., gasoline vapor or liquid and air) which is ignited, heated or spontaneously combusts after having been mixed together at the point of ignition, heating or combustion through the action of orifices 36a and 36b. Note that as employed herein, the term "gas" includes within its scope air. Ignited or spontaneously-combusted jets or streams of gas or liquid (working fluid) (providing force $f_1$) act on distal end 15 of non-piezoelectric resonating element 14 for a first predetermined period of time and at a pressure sufficient, and at a distance sufficiently close, to cause the desired amount of deflection of distal end 15 of resonating element 14, after which first predetermined period of time the supply of gas or liquid is terminated until the next cycle of providing force $f_1$ begins. The working fluid may be heated by at least one of convection, heat transfer, radiation, combustion, an exothermic chemical reaction and a nuclear reaction. The working fluid may be changed from a liquid to a gas. The working fluid may be confined, such that expansion is only allowed toward a distal end of the non-piezoelectric resonating element 14. It is preferable to detect a phase of the oscillations of the non-piezoelectric resonating element 14 with some device, such that the timing of the ignition, heating or spontaneously combustion of the working fluid may be adjusted. It is preferable to detect an amplitude of the oscillations of the non-piezoelectric resonating device 14. It is preferable that a device be chosen to adjust the amount of heat applied to the working fluid based on the detected amplitude of the oscillations of the non-piezoelectric resonating element 14. A duration of the ignited, heated or spontaneously combusted working fluid does not exceed one half of a period of resonant oscillations of the non-piezoelectric resonating element 14. The working fluid is heated once for each cycle of oscillation of the non-piezoelectric resonating element 14. However, the working fluid may be applied to opposing sides of the non-piezoelectric resonating element 14. As shown in FIG. 8, resonating element 14 deflects into first position a under the action of force $f_1$, force $f_1$ abates, resonating element 14 deflects into second position b under the action of force $f_2$, and then oscillates and provides mechanical energy to piezoelectric element 12 through proximal end 17. A portion of the mechanical energy transferred into piezoelectric element 12 from resonating element 14 is converted into electrical energy by piezoelectric element 12. After a second predetermined period of time has passed since the termination of providing external force $f_1$, force $f_1$ is provided again to deflect element 14 into first position a, and the process repeats.

FIGS. 1 through 8 illustrate some fundamental concepts associated with the various embodiments of the present invention. One such concept is that externally-provided force $f_1$ may be supplied according to any of a number of different methods and devices, including, but not limited to, resonating element 14 being excited by an external force or member having or providing: (a) substantially the same principal resonant frequency as element 14; (b) a principal resonant frequency lower than the principal resonating frequency of element 14; (c) a principal resonant frequency higher than the principal resonating frequency of element 14; (c) a series of single impacts; (d) contact pressure or force; (e) a magnetic or electric field formed by permanent magnets, one or more coils or a moving wire; (f) acceleration of a proof mass (g) pressure of a liquid, gas or steam; (h) pressure created by combustion; (i) force delivered generally through rotational motion; (j) force delivered generally through linear translational motion; (k) force acting in a direction parallel to the direction of motion of resonating element 14; (l) force acting in a direction perpendicular to the direction of motion of resonating element 14; (m) force acting in a direction that is neither parallel nor perpendicular to the direction of motion of resonating element 14; (n) force acting on a plurality of resonating elements 14 sequentially or one at a time; and (0) force acting on a plurality of resonating elements 14 simultaneously or near-simultaneously.

Another fundamental concept illustrated or inferred by FIGS. 1 through 8 is that resonating element 14 may assume any of a number of different forms and embodiments, including, but not limited to: (a) a plurality of resonating elements 14 each having a different principal resonant frequency; and (b) a plurality of resonating elements 14 linked together to form a single resonating element 14.

Figure 9:
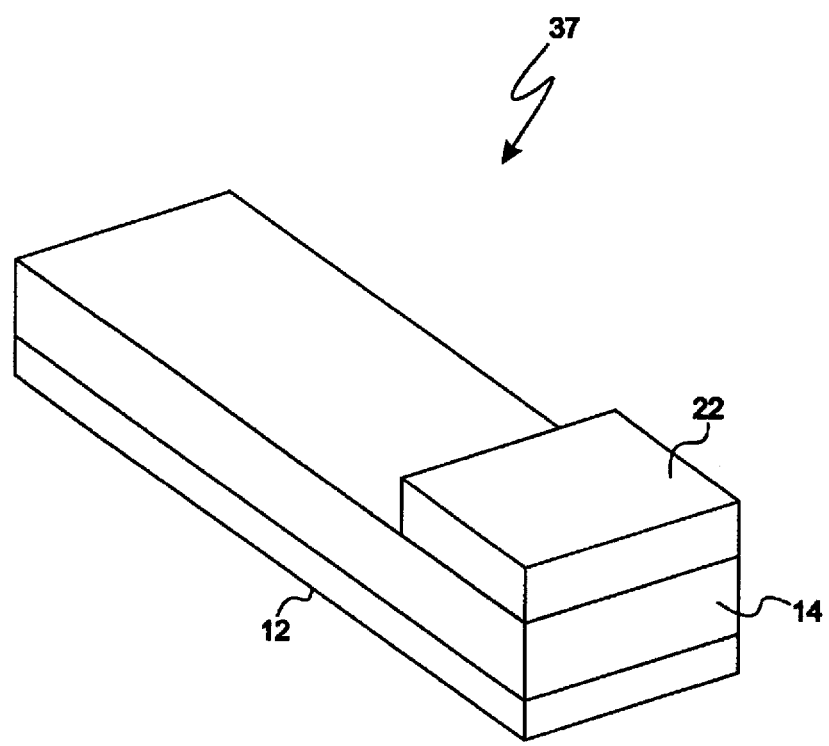
FIG. 9 shows one embodiment of a MEMS device according to one embodiment of the present invention.

FIG. 9 shows MEMS device 37 according to one embodiment of the present invention. MEMS device 37 comprises a piezoelectric element 12, silicon layer 14 (which forms non-piezoelectric resonating element 14) and magnetic layer 22. MEMS device 37 may be mounted on or otherwise incorporated into a silicon substrate and used to generate electricity or periodic electrical signals, or may be configured to form a miniature piezoelectric motor or transformer. Reference is made to U.S. Pat. Nos. 5,691,752; 6,013,970; 6,347,862; 6,911,107; 7,081,693 and 7,089,638 listed hereinabove for further details concerning fabrication of MEMS devices having piezoelectric layers or elements incorporated THEREIN. Silicon layer 14 may be fabricated using any of a number of deposition, photo-lithography, crystalline growth, micro-machining, etching, sol-gel and other techniques and processes well known in the MEMS fabrication and thin-film manufacturing arts.

Figure 10A:
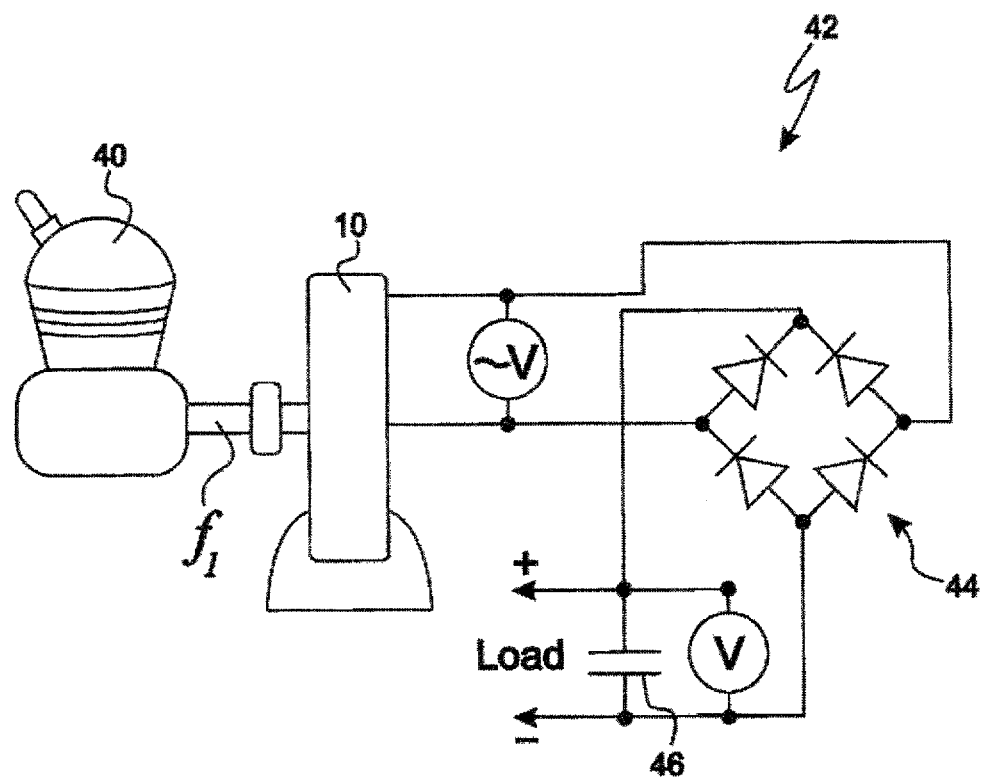
FIGS. 10a through 10c show some embodiments of electricity generating systems of the present invention.

FIG. 10a shows one embodiment of an electricity generating system of the present invention. Externally-provided force $f_1$ is shown as being supplied by motor 40, which causes an output shaft to rotate and thereby provide force $f_1$ to piezoelectric generator 10, which may assume any of the forms described above, or any combination or modification thereof. Note, however, that externally-provided force $f_1$ may be supplied by any of a number of different devices or methods, including, but not limited to, wind-powered devices, solar-powered devices, hand-cranks, internal combustion engines, and so on. Alternating-current electricity generated by piezoelectric generator 10 is supplied to circuit 42, which rectifies ac current into DC current in sub-circuit 44 and provides a DC output across the indicated output load terminals and battery or capacitor 46.

Figure 10B:
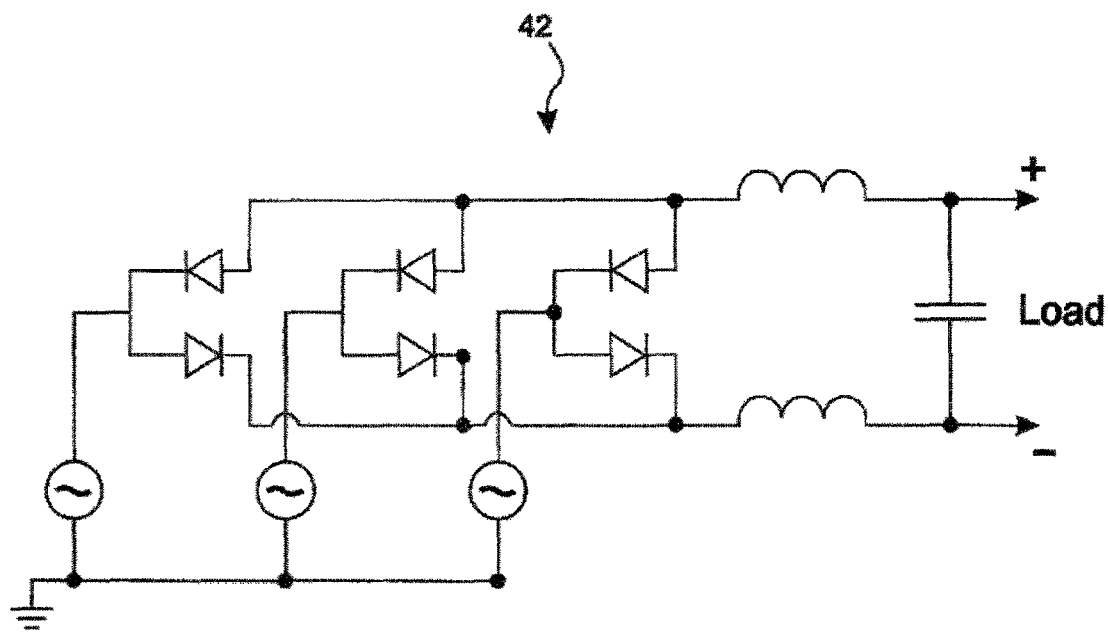
Figure 10C:
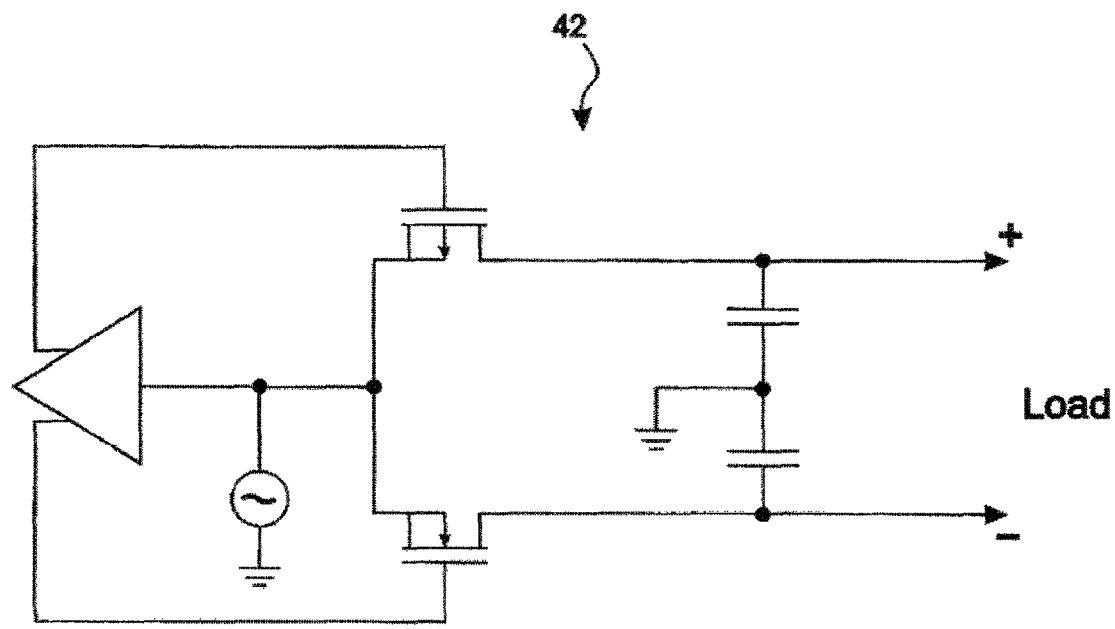
Figure 11:
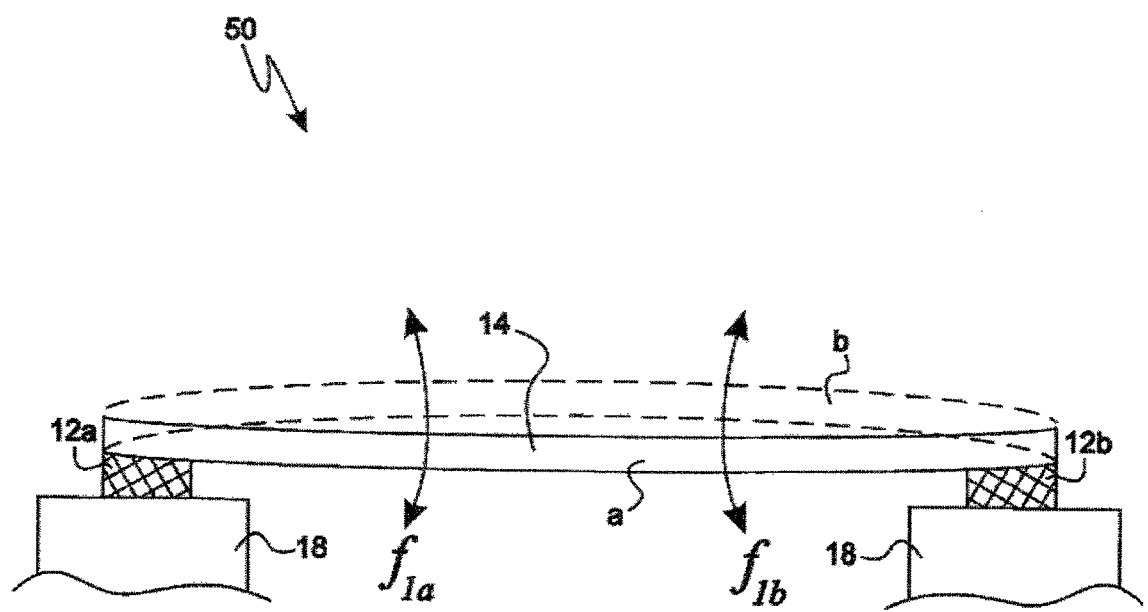
FIG. 11 shows one embodiment of a transformer the present invention.

In another embodiment of the present invention, and as shown in FIG. 10b, circuit 42 is a multi-phase frequency rectifier circuit employing an LC filter, which is particularly useful in applications where multiple resonating elements 12 resonate at different frequencies. In yet another embodiment, and as shown in FIG. 10c, circuit 42 is a synchronous bipolar rectifier circuit employing power switching FETs instead of diodes. Upon having read and understood the specification, claims and drawings hereof, those skilled in the art will understand that a virtually infinite number of suitable embodiments of circuits 42 may be devised by one skilled in the art to convert the ac output provided by piezoelectric generator 10 into a DC output voltage, that circuits 42 shown in FIG. 11 illustrate but three such embodiments, and that such circuits 42 will fall within the scope of the present invention. Those skilled in the art will further understand that a virtually infinite number of different devices and applications may be driven by the output voltage provided by such circuits, such as battery charging circuits, charging batteries, providing DC current to one or more devices, powering DC devices, powering hybrid automobiles, and so on.

FIG. 11 shows one embodiment of transformer 50 of the present invention, where resonating element 14 is excited initially by an external voltage or current provided to piezoelectric element 12, where such voltage or frequency has a frequency which substantially matches the principal resonant frequency of resonating element 14. In response to displacement induced in piezoelectric element 12a by the external current or voltage, resonating element 14 oscillates in place and dissipates mechanical energy into piezoelectric element 12b, which is configured to act as a load to resonating element 14. Electrical energy of the same frequency as that provided to piezoelectric element 12a is output by piezoelectric element 12b, but may have a different voltage depending on the particular design parameters selected for the various components of transformer 50 illustrated in FIG. 12.

Figure 12:
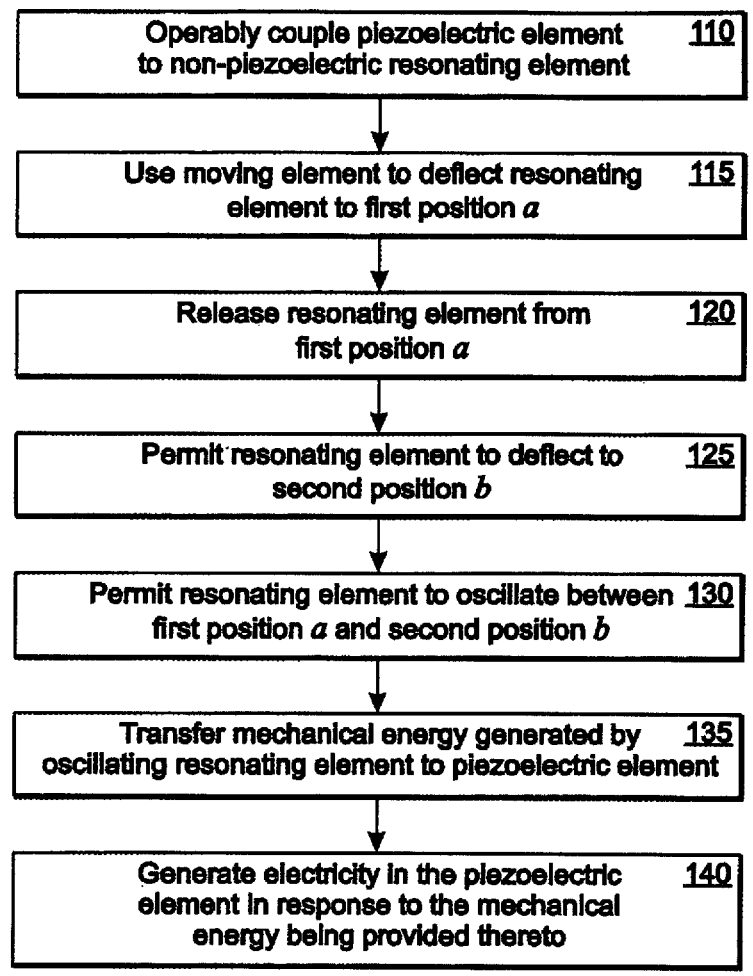
FIG. 12 shows one embodiment of a method of the present invention for generating electricity.

FIG. 12 shows one embodiment of a method of the present invention for generating electricity. In step 110, piezoelectric element 12 is operably coupled to non-piezoelectric resonating element 14. In step 115, moving element 16 is used to deflect resonating element 14 to first position a. In step 120, resonating element 14 is released from first position a and permitted in step 125 to deflect to position b. Resonating element 14 then oscillates between first position a and second position b in step 130. In step 135, at least a portion of mechanical energy generated by the oscillation of resonating element 14 is transferred to piezoelectric element 12. In step 140, electricity is generated by piezoelectric element 12 in response to the mechanical energy being provided thereto. Upon having read and understood the specification, claims and drawings hereof, those skilled in the art will realize that a virtually infinite number of variations and modifications of the foregoing method may be devised by one skilled in the art, and that such variations and modifications will fall within the scope of the present invention.

The preceding specific embodiments are illustrative of the practice of the invention. It is to be understood, therefore, that other expedients known to those skilled in the art or disclosed herein may be employed without departing from the invention or the scope of the appended claims. For example, the present invention is not limited to resonating elements in piezoelectric machines or systems where one or more resonating elements 14 deform or deflect in reaction to compressional forces being applied thereto, but also where one or more resonating elements 14 deform or deflect in reaction to shear or bending forces being applied thereto, or to any combination of compressional, shear or bending forces being applied thereto. Piezoelectric element 12 of the present invention is not limited to embodiments having a single layer of piezoelectric material. Instead, piezoelectric element 12 may comprise any suitable number of layers of piezoelectric material laminated, glued, compressed or otherwise bound or held together. Piezoelectric element 12 may be formed of any suitable piezoelectric material, the processes for making same being well known in the art. In addition, the present invention includes within its scope systems, devices, components and methods where one device serves as both a piezoelectric generator and a piezoelectric motor. One application for such a device is in a hybrid automobile or other hybrid transportation device such as a hybrid motorcycle, hybrid bicycle or hybrid boat or vessel.

Note further that the present invention includes within its scope not only piezoelectric generators, but also piezoelectric motors, wherein the processes and steps described hereinabove are basically reversed such that: (a) externally-provided electrical current and voltage are supplied to piezoelectric element 12; (b) element 12 is operably coupled to proximal end 17 of resonating element 14 and transfers mechanical energy thereto in response to piezoelectric element 12 deforming and generating displacement of portions thereof as electrical current and voltage are supplied thereto; (c) resonating element 14 oscillates in response to mechanical energy being provided thereto by piezoelectric element 12; (d) distal end 17 of resonating element deflects into first position a, and engages and causes translational movement or motion of moving element 16; (e) distal end 17 of resonating element deflects into second position b; (f) steps (a) through (e) are repeated. In the general case where a piezoelectric motor of the present invention is to be operated in accordance with the steps outlined above, however, some external force typically must be provided to set the stator or equivalent element in motion initially.

Piezoelectric element 12 may be attached to proximal end 17 using any of a number of different means, including, but not limited to, clamps, frames or other structural members that compress, hold or secure a portion of piezoelectric element 12 therebetween, adhesives, epoxies, plastics, thermoplastics, fusing materials, fasteners, screws, nuts and bolts, rivets, and other means of affixing, fastening or otherwise attaching or bonding proximal end 17 to piezoelectric element 12. Other elements may also be disposed between proximal end 17 and piezoelectric element 12, such as springs, gears, deformable members, plastic, thermoplastic, metal, and the like, depending on the particular requirements and application at hand.

Figure 13:
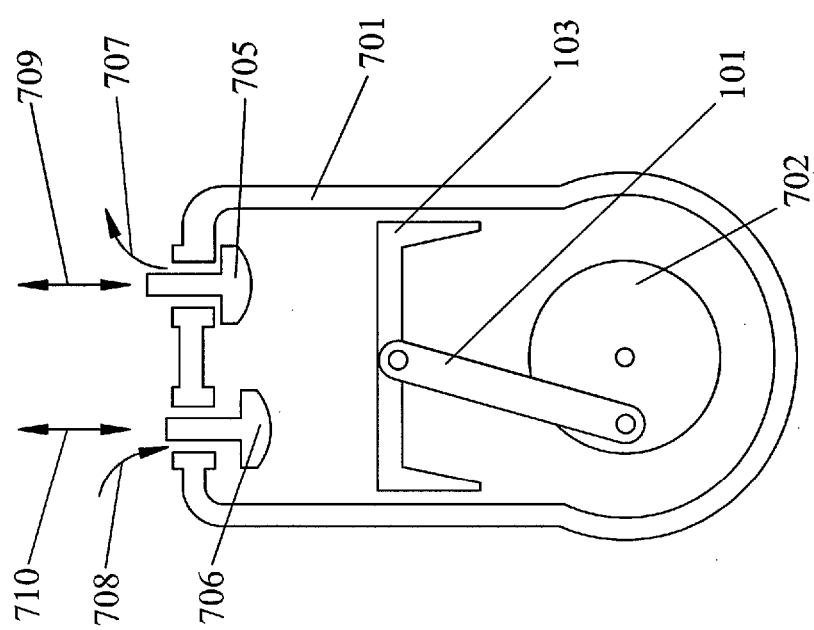
FIG. 13 depicts a reciprocating steam engine (prior art)

A wide variety of reciprocating heat engines is known. A common trait of such engines is the presence of some means of synchronization, that time heat delivery to a particular phase of crankshaft rotation. For example, in a steam engine depicted on FIG. 13, the flow of steam from the boiler (not shown), is controlled by the intake valve 706 and exhaust valve 705, in such a way that the intake valve opens when the piston 103 is near the top of the cylinder 701, thus allowing the flow of hot steam 708 to enter the cylinder and apply pressure on the piston 704. In turn, piston 103 transmits the pressure to the crankshaft 702 through the link 101. When the piston is near its bottom point in the cylinder, the intake valve 706 closes, while the exhaust valve 705 opens, allowing the flow of spent steam 707 to be pushed out of the cylinder as the piston moves up. Then the cycle repeats. Since the pressure of the hot steam is higher than the pressure of spent steam, such cycles result in the conversion of part of the thermal energy of hot steam into the mechanical energy of rotating crankshaft. The mechanical energy of the shaft can be used for variety of purposes, including driving an electrical generator.

Figure 14:
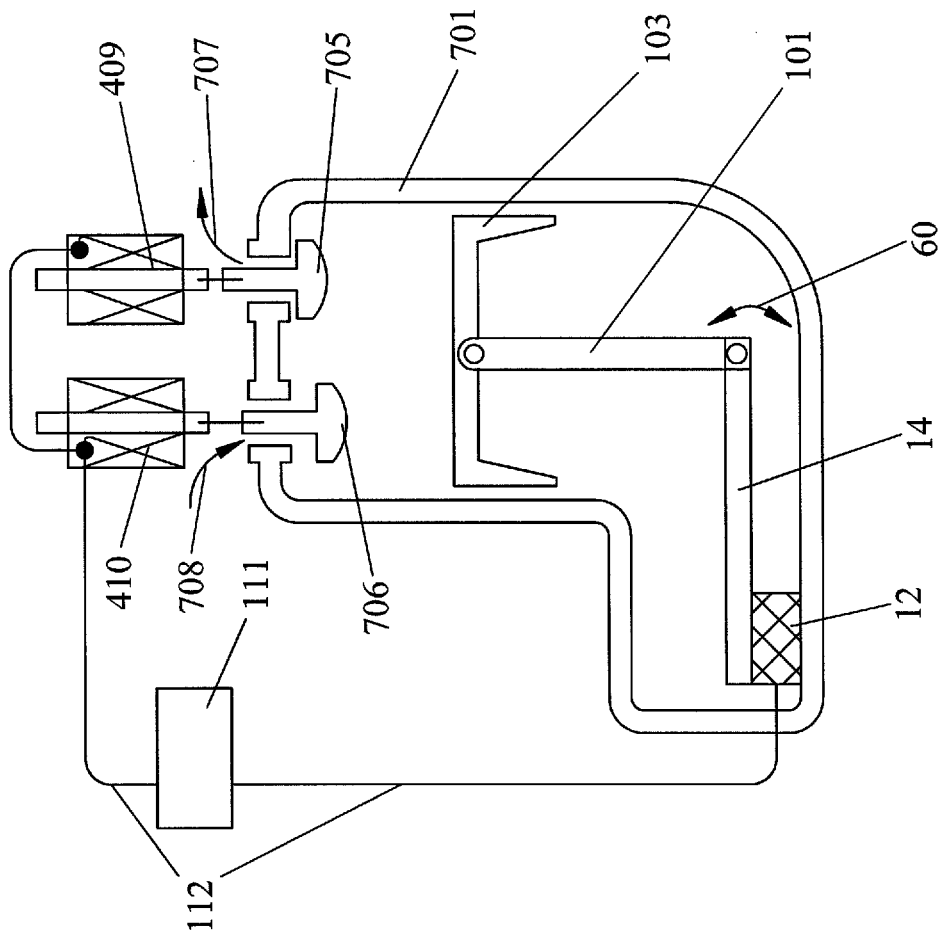
FIG. 14 depicts an embodiment of this invention with externally generated steam as a working fluid.

The correct work of steam engine, as well as other reciprocating engines, rely on synchronization of heat delivery with the rotation of crankshaft. On FIG. 13, such synchronization is shown diagrammatically, by valve drivers 709 and 710, that might be cams, other mechanical linkages, or electrically-driven devices. The gist of the present invention is in replacing the crankshaft of a reciprocating heat engine with a non-piezoelectric resonating element, as illustrated by FIG. 14. Unlike a conventional engine, such device would not be capable of producing any useful mechanical work, however, it can be still be used for electricity generation by virtue of coupling the non-piezoelectric resonating element to a piezo-electric element. The advantages of such a generator include a much higher frequency available from a resonating element in comparison with a conventional crankshaft, higher power output, more compact size and less mechanical wear.

The essential feature of the present invention is heat delivery synchronized with the oscillations of the non-piezoelectric resonating element 14. Such synchronization can be achieved by a variety of means, including mechanical linkages to the non-piezoelectric resonating element, or, as depicted on FIG. 14, electronic synchronization block 111 timed by the voltage generated by piezoelectric element 12 and energizing solenoids 409 and 410 through wiring 112, that are, in turn, driving valves 705 and 706. In other aspects the generator on FIG. 14 operates analogous to the steam engine of FIG. 13, except that piston 103 is linked to the oscillatory motion of the tip of the non-piezoelectric resonating element 14 (shown with the arrow 60), rather than rotational motion of the crankshaft 702.

Figure 15:
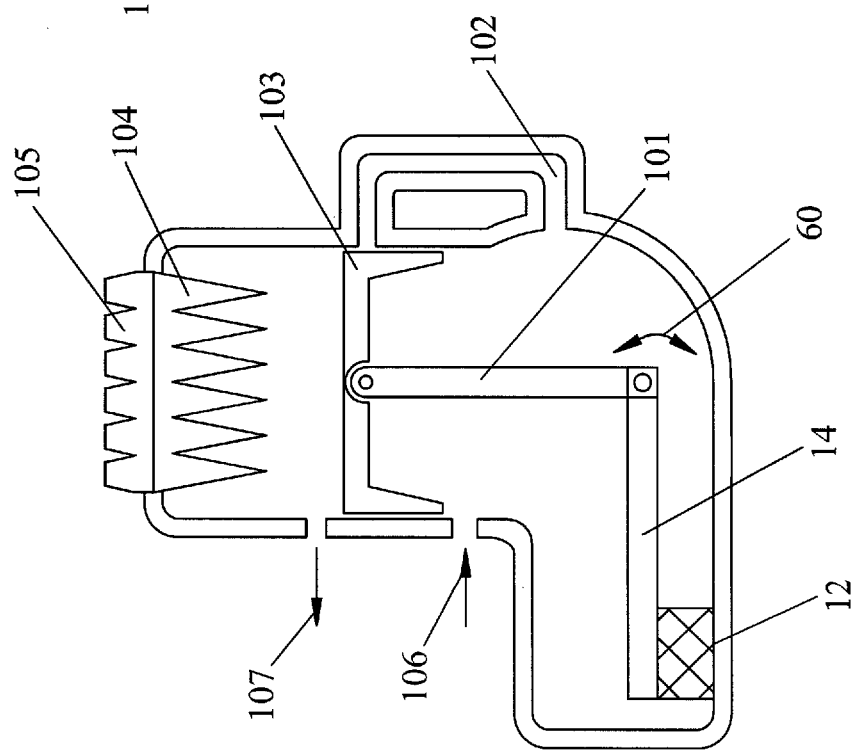
FIG. 15 depicts an embodiment of this invention with ambient air as a working fluid and external heat source.

Another embodiment of the present invention is illustrated on FIG. 15. Ambient air 106 is admitted into the generator during the upward motion of the piston 103, and then displaced through the transfer port 102 during the downward piston motion. During subsequent piston upward motion, it is compressed and directed toward the inner heat exchanger 104, while the outer heat exchanger 105 is heated by an external heat source, such as a burner, solar light, etc. so the heat is transferred to inner heat exchanger 104 and then to the air around it. In this implementation, the synchronization of heat delivery with the motion of the non-piezoelectric element 14 occurs by virtue of increased heat transfer into compressed air while the piston is near its topmost position, in comparison with relatively thin air above the piston near its bottom position. Respectively, a portion of the heat transferred to the ambient air 106 through the heat exchangers 105 and 104 is not removed by the exhaust air 107, but rather converted into mechanical energy of the oscillations of the non-piezoelectric resonating element, and then further into the electrical energy.

Figure 16:
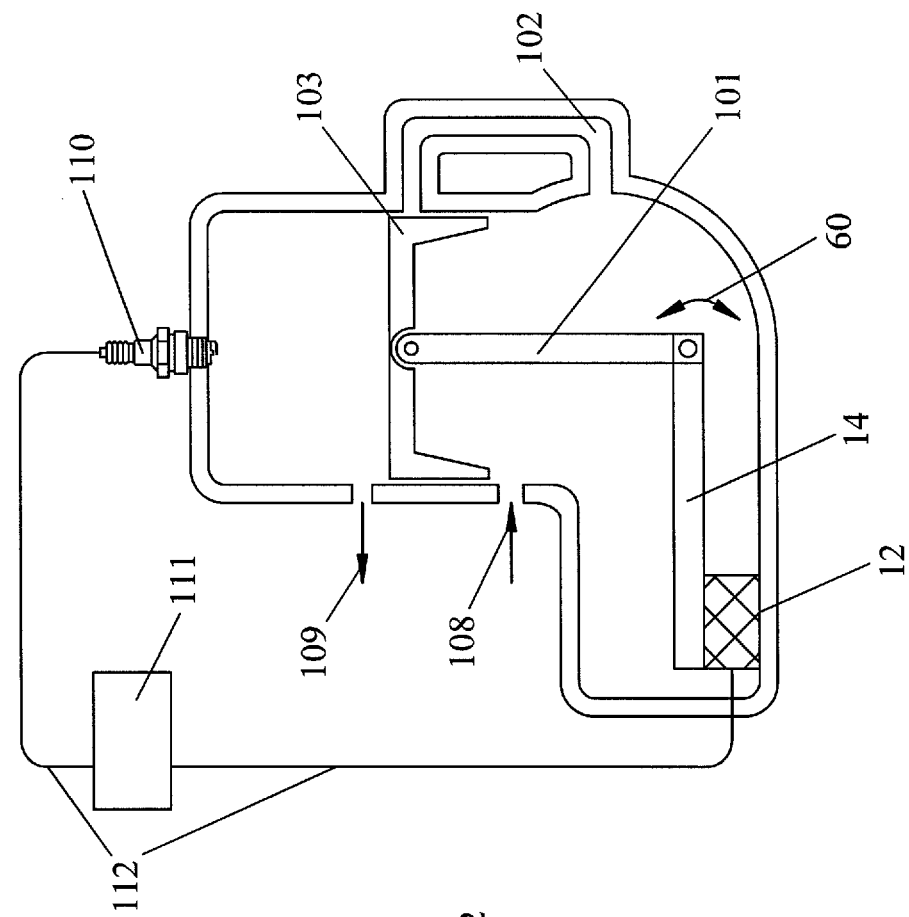
FIG. 16 depicts an embodiment of this invention with combustible mix as a working fluid and a spark plug, synchronized to the motion of the resonating element.

Yet another embodiment is illustrated on FIG. 16. Instead of ambient air 106, a combustible mix 108 is admitted into the generator, during the upward motion of the piston 103, and then and likewise, displaced through the transfer port 102 during the downward piston motion, and then compressed during subsequent piston upward motion. With the piston near its topmost position, the combustible mix is ignited by a spark plug 110, via electronic synchronization block 111 and wiring 112, timed by the voltage generated by piezoelectric element 12. The ignition releases combustion heat, thus providing synchronization between the oscillations of the non-piezoelectric resonating element and heat delivery.

Figure 17:
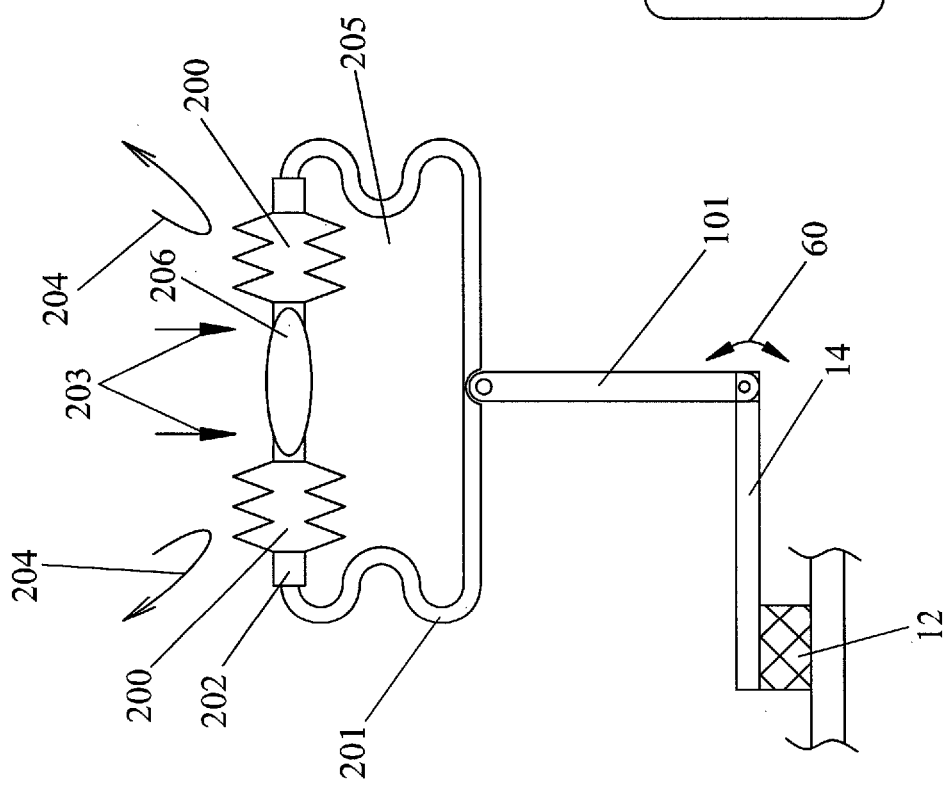
FIG. 17 depicts an embodiment of this invention with optically-absorbent working fluid and a pulsed laser as a heat source.

Yet another embodiment is illustrated on FIG. 17. In this embodiment, the working fluid 205 is trapped inside a sealed diaphragm working chamber 201. The heat source is a pulsed laser (not shown), delivering intense light pulses 203 through a window 206, that is transparent to the laser's wavelength, and installed in a stationary base plate 202. The working fluid, which can be either gaseous or liquid, is chosen to be absorptive for the wavelength of the laser. One example of such fluid would be sulfur hexafluoride, highly absorptive to radiation of common CO2 lasers at wavelength of around 10.6 um. Absorbing the power of the light pulses 203, the working fluid 205 heats up and expands, forcing the diaphragm working chamber 201 to stretch, thus driving the non-piezoelectric resonating element 14 through the link 101, thus transferring mechanical power to the resonating element. In the absence of optical power in-between adjacent laser pulses, the working fluid 205 cools down, losing heat through heat exchangers 200, which are also installed in the stationary base plate 202 and cooled externally by ambient air 204 or other means. As in other embodiments, the laser pulses are synchronized with the motion of the non-piezoelectric resonating element 14 via the voltage generated by the piezoelectric element 12 and some electronic or optical synchronization means (not shown).

Figure 18:
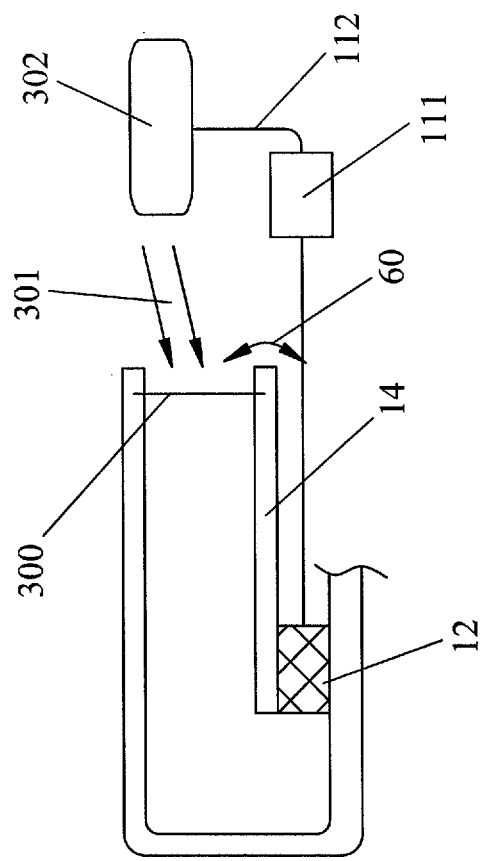
FIG. 18 depicts an embodiment of this invention with solid phase-changing material as working fluid and a pulsed laser as a heat source.

Yet another embodiment is illustrated on FIG. 18. Here, the function of the working fluid is fulfilled by a solid phase-changing material 300 with shape memory properties, such as nickel-titanium alloy, also known as nitinol. The heat source is the pulsed laser 302, synchronized with the motion of the non-piezoelectric resonating element 14 via the voltage generated by the piezoelectric element 12 electronic synchronization block 111 and wiring 112. The intense laser pulses 301 are absorbed by the phase-changing material, causing it to shrink, thus pulling the tip of the non-piezoelectric resonating element 14 and increasing the amplitude of its oscillations, as the pulses are synchronized with said oscillations.

Having read and understood the present disclosure, those skilled in the art will now understand that many combinations, adaptations, variations and permutations of known piezoelectric, electrical, electronic and mechanical systems, devices, components and methods may be employed successfully in the present invention.

In the claims, means plus function clauses are intended to cover the structures described herein as performing the recited function and their equivalents. Means plus function clauses in the claims are not intended to be limited to structural equivalents only, but are also intended to include structures which function equivalently in the environment of the claimed combination.

All printed publications and patents referenced hereinabove are hereby incorporated by referenced herein, each in its respective entirety.

I claim:

1. An electric power generator, comprising:
a non-piezoelectric resonating element;
a piezoelectric element, one side of said piezoelectric element attached to a proximal end of said non-piezoelectric element, the opposing side of said piezoelectric element to a base;
a heat source;
a working fluid configured to receive heat from said heat source, expand toward and apply pressure to a distal end of said non-piezoelectric resonating element to cause a distal end of said non-piezoelectric resonating element to oscillate;
means for synchronization that causes the working fluid to expand toward and apply pressure to a distal end of said non-piezoelectric resonating element in phase with the resonant oscillations of said non-piezoelectric resonating element.

2. The electric power generator of claim 1, wherein:
the working fluid applies pressure to a distal end of said non-piezoelectric resonating element through a piston, sliding inside a cylinder.

3. The electric power generator of claim 1, wherein:
the working fluid applies pressure to a distal end of said non-piezoelectric resonating element through a flexible membrane.

4. The electric power generator of claim 1, wherein:
the working fluid is gaseous, is undergoing expansion when heat is received.

5. The electric power generator of claim 1, wherein:
the working fluid is undergoing a transformation from liquid to gaseous phase when heat is received.

6. The electric power generator of claim 1, wherein:
the working fluid is undergoing a transformation from one solid phase to another when heat is received.

7. The electric power generator of claim 1, wherein:
the working fluid is a combustible mix undergoing combustion, said combustion being the source of heat.

8. The electric power generator of claim 1, wherein:
the means of synchronization include valves mechanically-coupled to said non-piezoelectric resonating element.

9. The electric power generator of claim 1, wherein:
the means of synchronization include valves electrically-driven synchronously to voltage generated by said piezo-electric element.

10. The electric power generator of claim 1, wherein:
the means of synchronization include ignition sources electrically-driven synchronously to the voltage generated by said piezo-electric element.

11. The electric power generator of claim 1, wherein:
the means of synchronization include pulsed lasers, driven synchronously to the voltage generated by said piezo-electric element.

* * * * *